United States Patent
Park et al.

(10) Patent No.: US 8,841,206 B2
(45) Date of Patent: Sep. 23, 2014

(54) METHOD OF FORMING POLYCRYSTALLINE SILICON LAYER, AND THIN FILM TRANSISTOR AND ORGANIC LIGHT EMITTING DEVICE INCLUDING THE POLYCRYSTALLINE SILICON LAYER

(75) Inventors: Byoung-Keon Park, Yongin (KR); Jong-Ryuk Park, Yongin (KR); Yun-Mo Chung, Yongin (KR); Tak-Young Lee, Yongin (KR); Jin-Wook Seo, Yongin (KR); Ki-Yong Lee, Yongin (KR); Min-Jae Jeong, Yongin (KR); Yong-Duck Son, Yongin (KR); Byung-Soo So, Yongin (KR); Seung-Kyu Park, Yongin (KR); Dong-Hyun Lee, Yongin (KR); Kil-Won Lee, Yongin (KR); Jae-Wan Jung, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 443 days.

(21) Appl. No.: 13/211,700

(22) Filed: Aug. 17, 2011

(65) Prior Publication Data
US 2012/0056187 A1 Mar. 8, 2012

(30) Foreign Application Priority Data
Sep. 3, 2010 (KR) .......................... 10-2010-0086511

(51) Int. Cl.
| | |
|---|---|
| *H01L 21/20* | (2006.01) |
| *H01L 21/36* | (2006.01) |
| *H01L 21/02* | (2006.01) |
| *H01L 29/786* | (2006.01) |
| *H01L 29/66* | (2006.01) |
| *H01L 27/32* | (2006.01) |

(52) U.S. Cl.
CPC ...... *H01L 29/78678* (2013.01); *H01L 21/0245* (2013.01); *H01L 29/66765* (2013.01); *H01L 21/02532* (2013.01); *H01L 29/78609* (2013.01); *H01L 21/02667* (2013.01); *H01L 21/02672* (2013.01); *H01L 27/3262* (2013.01)
USPC ............ 438/489; 438/500; 438/503; 438/488

(58) Field of Classification Search
CPC .................... H01L 21/02672; H01L 21/02667
USPC .................................. 438/488, 489, 500, 503
See application file for complete search history.

(56) References Cited

U.S. PATENT DOCUMENTS

| | | | | |
|---|---|---|---|---|
| 5,793,097 A | * | 8/1998 | Shimamoto et al. | .......... 257/538 |
| 6,713,371 B1 | * | 3/2004 | Gu | ................................ 438/488 |

(Continued)

FOREIGN PATENT DOCUMENTS

| | | |
|---|---|---|
| KR | 10-1998-0068689 A | 10/1998 |
| KR | 10-1999-0004670 A | 1/1999 |

(Continued)

*Primary Examiner* — Jarrett Stark
(74) *Attorney, Agent, or Firm* — Lee & Morse, P.C.

(57) ABSTRACT

A method of forming a polycrystalline silicon layer includes forming a first amorphous silicon layer and forming a second amorphous silicon layer such that the first amorphous silicon layer and the second amorphous silicon layer have different film qualities from each other, and crystallizing the first amorphous silicon layer and the second amorphous silicon layer using a metal catalyst to form a first polycrystalline silicon layer and a second polycrystalline silicon layer. A thin film transistor includes the polycrystalline silicon layer formed by the method and an organic light emitting device includes the thin film transistor.

6 Claims, 9 Drawing Sheets

(56) References Cited

U.S. PATENT DOCUMENTS

| | | | |
|---|---|---|---|
| 6,835,608 B2* | 12/2004 | Jang et al. | 438/166 |
| 7,697,094 B2* | 4/2010 | Yang et al. | 349/114 |
| 2002/0179001 A1* | 12/2002 | Jung | 117/4 |
| 2004/0106240 A1* | 6/2004 | Peng et al. | 438/166 |
| 2007/0105305 A1* | 5/2007 | Gu | 438/255 |
| 2009/0272978 A1* | 11/2009 | Liu et al. | 257/71 |
| 2010/0012942 A1* | 1/2010 | Ryu et al. | 257/66 |

FOREIGN PATENT DOCUMENTS

| | | |
|---|---|---|
| KR | 10-2006-0002397 A | 1/2006 |
| KR | 10-0770268 B1 | 10/2007 |

* cited by examiner

METHOD OF FORMING POLYCRYSTALLINE SILICON LAYER, AND THIN FILM TRANSISTOR AND ORGANIC LIGHT EMITTING DEVICE INCLUDING THE POLYCRYSTALLINE SILICON LAYER

BACKGROUND

1. Field

This disclosure relates to a method of forming a polycrystalline silicon layer, a thin film transistor including the polycrystalline silicon layer, and an organic light emitting device.

2. Description of the Related Art

A thin film transistor is a switching and/or driving device, and includes an electrode and an active layer. The active layer mainly includes silicon, which may be classified as amorphous silicon or polycrystalline silicon depending on the crystal states.

Since the polycrystalline silicon has higher mobility compared to the amorphous silicon, a thin film transistor including polycrystalline silicon may provide a high response speed and low power consumption.

Methods of forming polycrystalline silicon may include solid-phase crystallization (SPC) and excimer laser crystallization (ELC). However, the solid-phase crystallization involves heat treatment at a high temperature for a long time thus causing deformation of a substrate, and the excimer laser crystallization requires expensive laser equipment and has difficulty in uniformly crystallizing a substrate on the whole.

To compensate the above crystallization methods, metal induced crystallization (MIC), metal induced lateral crystallization (MILC), super grain silicon crystallization (SGS), etc., which crystallize using a metal catalyst, have been suggested. However, according to the above crystallization methods, large quantities of metal catalysts may still remain in the polycrystalline silicon layer, and thus thin film transistor characteristics may be affected.

SUMMARY

An exemplary embodiment provides a method of forming a polycrystalline silicon layer that may improve characteristics of a thin film transistor.

Another embodiment provides a thin film transistor including the polycrystalline silicon layer formed by the method.

Yet another embodiment provides an organic light emitting device including the thin film transistor.

According to an embodiment, there is provided a method of forming a polycrystalline silicon layer, including forming a first amorphous silicon layer and forming a second amorphous silicon layer such that the first amorphous silicon layer and the second amorphous silicon layer have different film qualities from each other, and crystallizing the first amorphous silicon layer and the second amorphous silicon layer using a metal catalyst to form a first polycrystalline silicon layer and a second polycrystalline silicon layer.

The first polycrystalline silicon layer and the second polycrystalline silicon layer may have different grain sizes from each other.

The second polycrystalline silicon layer may have a smaller grain size than the first polycrystalline silicon layer.

The forming of the first amorphous silicon layer and the second amorphous silicon layer having different film qualities from each other may include depositing the first amorphous silicon layer while providing a first gas, and depositing the second amorphous silicon layer while providing a second gas.

The first gas may include argon gas, and the second gas includes hydrogen gas.

The first polycrystalline silicon layer and the second polycrystalline silicon layer may include silicide formed by bonding of the metal catalyst and silicon, and the first polycrystalline silicon layer may have a higher silicide content than the second polycrystalline silicon layer.

An amount of the metal catalyst used in the first amorphous silicon layer and an amount of the metal catalyst used in the second amorphous silicon layer may be substantially equivalent.

According to an embodiment, there is provided a thin film transistor including a polycrystalline silicon layer that is crystallized using a metal catalyst, a gate electrode overlapping with the polycrystalline silicon layer, and a source electrode and a drain electrode electrically connected with the polycrystalline silicon layer, wherein the polycrystalline silicon layer includes a first polycrystalline silicon layer and a second polycrystalline silicon layer having different grain sizes from each other.

The first polycrystalline silicon layer may be positioned closer to the gate electrode than the second polycrystalline silicon layer.

The second polycrystalline silicon layer may have a smaller grain size than the first polycrystalline silicon layer.

The first polycrystalline silicon layer and the second polycrystalline silicon layer may include silicide formed by bonding of the metal catalyst and silicon, and the first polycrystalline silicon layer may have a higher silicide content than the second polycrystalline silicon layer.

According to an embodiment, there is provided an organic light emitting device including a thin film transistor including a gate electrode, a polycrystalline silicon layer that overlaps with the gate electrode and is crystallized using a metal catalyst, and a source electrode and a drain electrode opposite each other with the polycrystalline silicon layer as the center, a first electrode electrically connected with the thin film transistor, a second electrode opposite to the first electrode, and an emission layer positioned between the first electrode and the second electrode, wherein the polycrystalline silicon layer includes a first polycrystalline silicon layer and a second polycrystalline silicon layer having different grain sizes from each other.

The first polycrystalline silicon layer may bes positioned closer to the gate electrode than the second polycrystalline silicon layer.

The second polycrystalline silicon layer may have a smaller grain size than the first polycrystalline silicon layer.

The first polycrystalline silicon layer and the second polycrystalline silicon layer may include silicide formed by bonding of the metal catalyst and silicon, and the first polycrystalline silicon layer has a higher silicide content than the second polycrystalline silicon layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
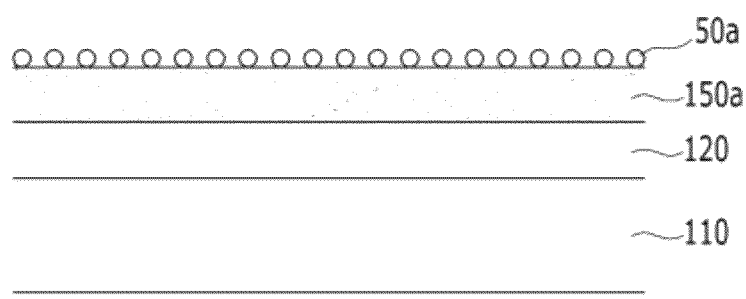
FIG. 1 to FIG. 4 illustrate cross-sectional views sequentially showing a method of forming a polycrystalline silicon layer according to one embodiment.

Korean Patent Application No. 10-2010-0086511, filed on Sep. 3, 2010, in the Korean Intellectual Property Office, and entitled: "Method of Forming Polycrystalline Silicon Layer, and Thin Film Transistor and Organic Light Emitting Device Including the Polycrystalline Silicon Layer," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will also be understood that when a layer is referred to as being "between" two layers, it can be the only layer between the two layers, or one or more intervening layers may also be present. Like reference numerals refer to like elements throughout.

Hereinafter, a method of forming a polycrystalline silicon layer according to one embodiment will be explained with reference to FIG. 1 to FIG. 4.

FIG. 1 to FIG. 4 illustrate cross-sectional views sequentially showing a method of forming a polycrystalline silicon layer according to one embodiment.

Referring to FIG. 1, on a substrate 110 made of a material such as glass, a polymer, or a silicon wafer, a buffer layer 120 is formed. The buffer layer 120 may be formed by, for example, a chemical vapor deposition (CVD) method using silicon oxide or silicon nitride and the like. The buffer layer 120 may block transfer of impurities generated from the substrate 110 or moisture inflowing from the outside to the upper layer, and may control the heat transfer rate during heat treatment that will be described below, thereby enabling uniform crystallization.

Subsequently, a lower amorphous silicon layer 150a is formed on the buffer layer 120. The lower amorphous silicon layer 150a may be formed by, for example, a chemical vapor deposition (CVD) method using silane gas.

Then, a metal catalyst 50a is formed on the lower amorphous silicon layer 150a.

The metal catalyst 50a becomes a seed for crystallization of the lower amorphous silicon layer 150a by heat treatment that will be described below. The metal catalyst 50a may be formed at a low concentration by an SGS crystallization method. The metal catalyst 50a may be formed with areal density of about $1*10^{12}$ cm$^{-2}$ to about $1*10^{15}$ cm$^{-2}$. Within the above range of density, a polycrystalline silicon layer having suitable grain size may be formed.

Figure 2:
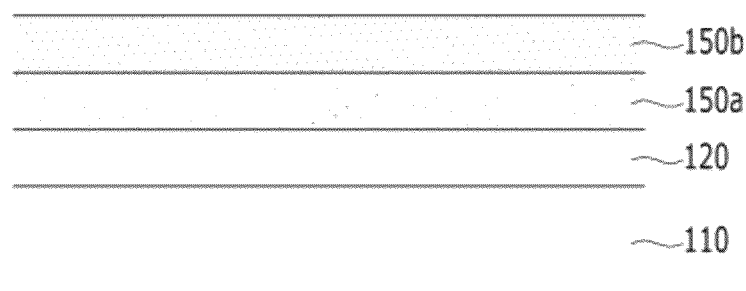

Referring to FIG. 2, an upper amorphous silicon layer 150b is formed on the lower amorphous silicon layer 150a. The upper amorphous silicon layer 150b may be also formed by, for example, a chemical vapor deposition (CVD) method using silane gas.

The lower amorphous silicon layer 150a and the upper amorphous silicon layer 150b may be formed with different film qualities from each other. The film qualities of the lower amorphous silicon layer 150a and the upper amorphous silicon layer 150b may be made different by supplying different kinds of gases that are supplied together with silane gas when depositing the lower amorphous silicon layer 150a and the upper amorphous silicon layer 150b.

For example, when depositing the lower amorphous silicon layer 150a, argon (Ar) gas may be supplied together with silane gas, and when depositing the upper amorphous silicon layer 150b, hydrogen (H$_2$) gas may be supplied together with silane gas. In this case, the upper amorphous silicon layer 150b supplied with hydrogen gas may have a lower defect density than the lower amorphous silicon layer 150a supplied with argon gas.

Figure 3:
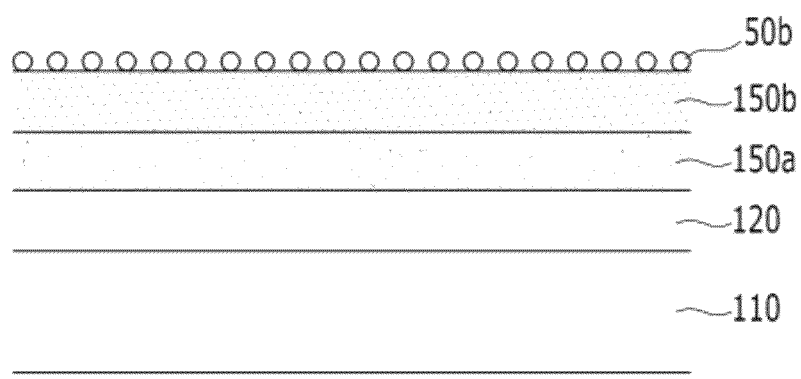

Referring to FIG. 3, a metal catalyst 50b is formed on the upper amorphous silicon layer 150b. The metal catalyst 50b becomes a seed for crystallization of the upper amorphous silicon layer 150b by heat treatment that will be described below. The metal catalyst 50b may be formed in a substantially equivalent amount with regard to the metal catalyst 50a formed on the lower amorphous silicon layer 150a.

The metal catalysts 50a and 50b may be selected from, for example, nickel (Ni), silver (Ag), gold (Au), copper (Cu), aluminum (Al), tin (Sn), cadmium (Cd), alloys thereof, or combinations thereof.

Subsequently, the substrate is heat treated.

Figure 4:
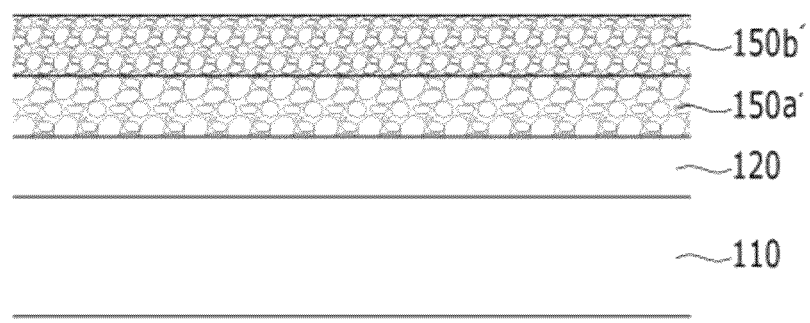

Referring to FIG. 4, during the heat treatment, the lower amorphous silicon layer 150a and the upper amorphous silicon layer 150b are formed as a lower polycrystalline silicon layer 150a' and an upper polycrystalline silicon layer 150b' including a plurality of crystalline grains using the metal catalysts 50a and 50b, and silicon making up the lower amorphous silicon layer 150a and the upper amorphous silicon layer 150b bonds to the metal catalysts 50a and 50b to form silicide.

As described above, when depositing the lower amorphous silicon layer 150a and the upper amorphous silicon layer 150b, different kinds of gases are supplied to form them with different film qualities, thereby forming the lower amorphous silicon layer 150a and the upper amorphous silicon layer 150b with different defect densities in the films. For example, as explained, if argon (Ar) gas is supplied together with silane gas when depositing the lower amorphous silicon layer 150a, and hydrogen (H$_2$) gas is supplied together with silane gas when depositing the upper amorphous silicon layer 150b, the lower amorphous silicon layer 150a may have larger defect density than the upper amorphous silicon layer 150b, and thus more metal silicide may be formed in the lower amorphous silicon layer 150a.

The lower polycrystalline silicon layer 150a' and the upper polycrystalline silicon layer 150b' formed by heat treatment may have different grain sizes from each other.

As described above, if argon gas is supplied to the lower amorphous silicon layer 150a and hydrogen gas is supplied to the upper amorphous silicon layer 150b, the upper polycrystalline silicon layer 150b' may have a smaller grain size than the lower polycrystalline silicon layer 150a'. Thus, the lower polycrystalline silicon layer 150a and the upper polycrystalline silicon layer 150b may be formed with different grain sizes, while using substantially equivalent amounts of metal catalysts 50a and 50b.

Thereby, for a thin film transistor with a top gate structure including polycrystalline silicon layers 150a' and 150b' as active layers, an upper polycrystalline silicon layer 150b' having a channel may be formed with a small grain size, thereby improving uniformity of thin film transistor characteristics. Further, since there is no need to increase the amount of metal catalyst for reducing grain size, a leakage current increase may be prevented.

Now, a thin film transistor including a polycrystalline silicon layer formed according to the above explained method will be described referring to FIG. 5.

Figure 5:
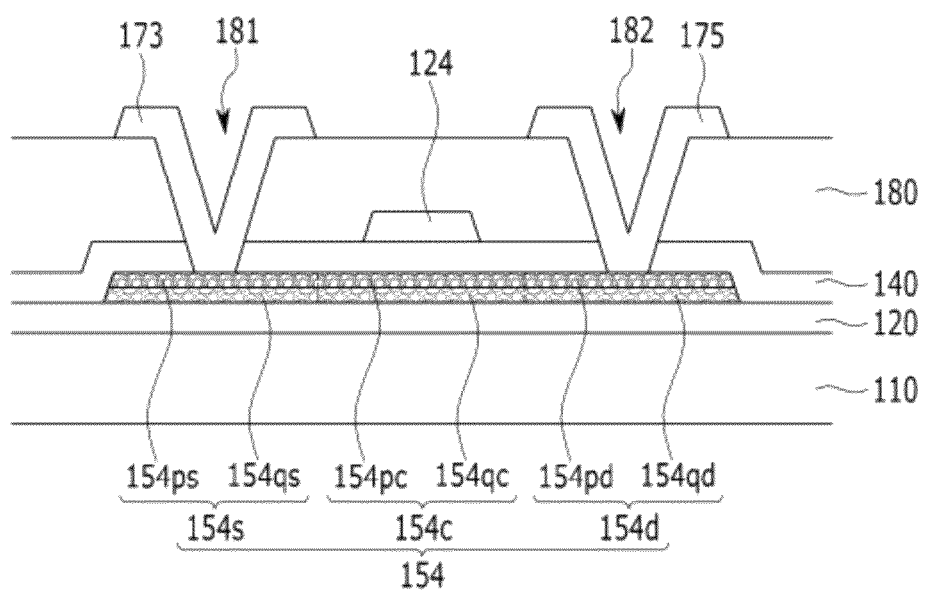
FIG. 5 illustrate a cross-sectional view of a thin film transistor according to one embodiment.

FIG. 5 illustrates a cross-sectional view of a thin film transistor according to one embodiment.

A buffer layer 120 is formed on a substrate 110, and a semiconductor pattern 154 is formed on the buffer layer 120. The semiconductor pattern 154 includes two polycrystalline silicon layers 154p and 154q formed by patterning the above-described lower polycrystalline silicon layer 150a' and upper polycrystalline silicon layer 150b'. The two patterned polycrystalline silicon layers 154p and 154q have different grain sizes from each other as explained above.

The semiconductor pattern 154 has a channel region 154c, a source region 154s, and a drain region 154d, and the source region 154s and the drain region 154d may be doped with p-type or n-type impurities. As shown in FIG. 5, and for at least the same reasons described above, the channel region 154c includes an upper channel region 154pc and a lower channel region 154qc, the source region 154s includes an upper source region 154ps and a lower source region 154qs, and the drain region 154d includes an upper drain region 154pd and a lower drain region 154qd.

A gate insulating layer 140 is formed on the semiconductor pattern 154. The gate insulating layer 140 may be formed of silicon oxide, silicon nitride, and the like.

A gate electrode 124 is formed on the gate insulating layer 140. The gate electrode 124 overlaps with the channel region 154c of the semiconductor pattern 154.

An insulation layer 180 is formed on the gate electrode 124, and the insulation layer 180 has contact holes 181 and 182 respectively exposing the source region 154s and the drain region 154d of the semiconductor pattern 154.

A source electrode 173 and a drain electrode 175 respectively connected with the source region 154s and the drain region 154d of the semiconductor pattern 154 through the contact holes 181 and 182 are formed on the insulation layer 180.

Hereinafter, a method of forming the thin film transistor will be described referring to FIG. 6 to FIG. 10 together with FIG. 5 and FIG. 1 to FIG. 4.

FIG. 6 to FIG. 10 illustrate cross-sectional views showing a method of forming a thin film transistor according to one embodiment.

According to the above-described method of FIG. 1 to FIG. 4, a buffer layer 120, and a lower polycrystalline silicon layer 150a' and upper polycrystalline silicon layer 150b' having different grain sizes from each other are formed on a substrate 110.

Figure 6:
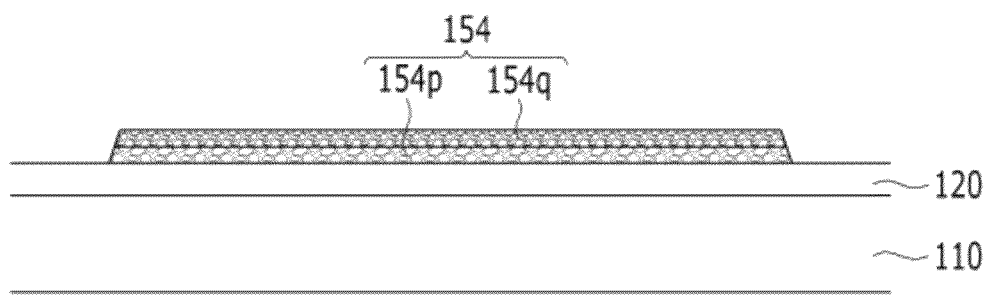
FIG. 6 to FIG. 10 illustrate cross-sectional views showing a method of fabricating a thin film transistor according to one embodiment.

Referring to FIG. 6, the lower polycrystalline silicon layer 150a' and the upper polycrystalline silicon layer 150b' are patterned to form a semiconductor pattern 154 including a lower semiconductor pattern 154p and an upper semiconductor pattern 154q.

Figure 7:
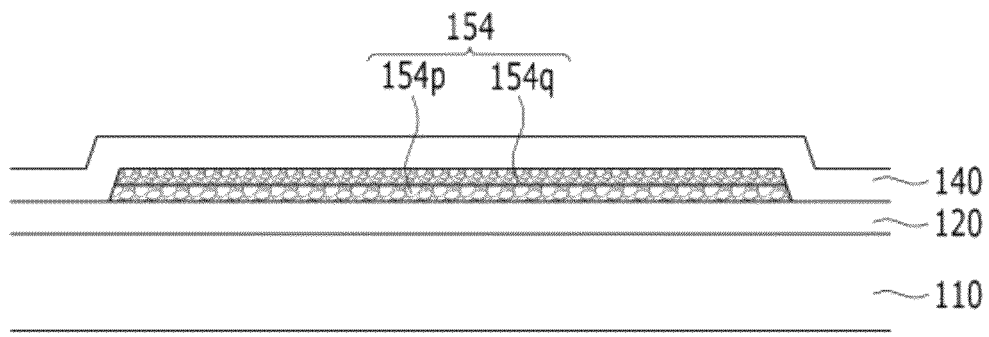

Referring to FIG. 7, a gate insulating layer 140 is formed on the semiconductor pattern 154. The gate insulating layer 140 may be formed by, for example, a chemical vapor deposition (CVD) method using silicon oxide or silicon nitride.

Figure 8:
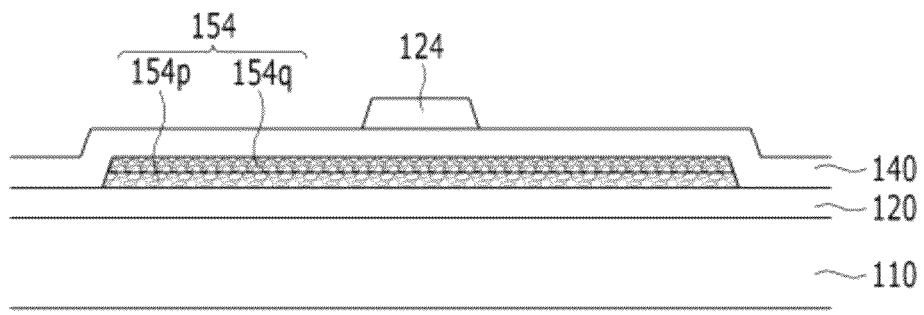

Referring to FIG. 8, a gate electrode 124 is formed on the gate insulating layer 140.

Figure 9:
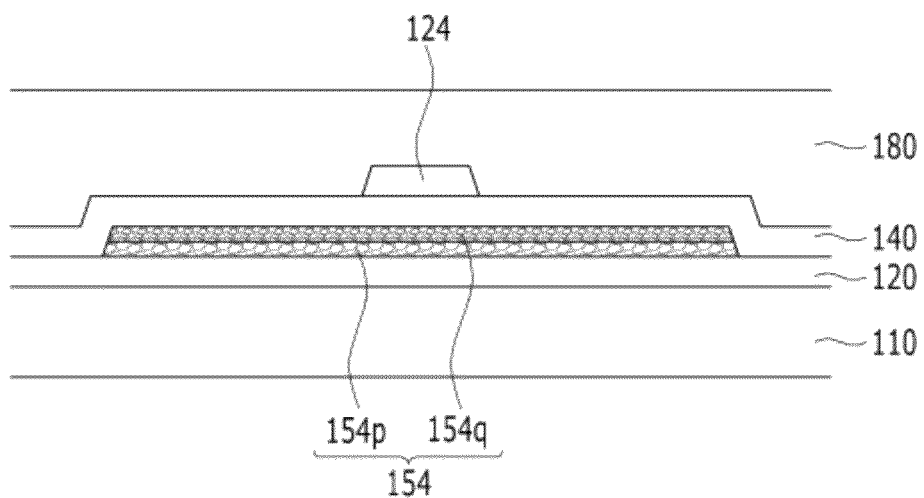

Referring to FIG. 9, an insulation layer 180 is formed on the gate electrode 124 and the gate insulating layer 140.

Figure 10:
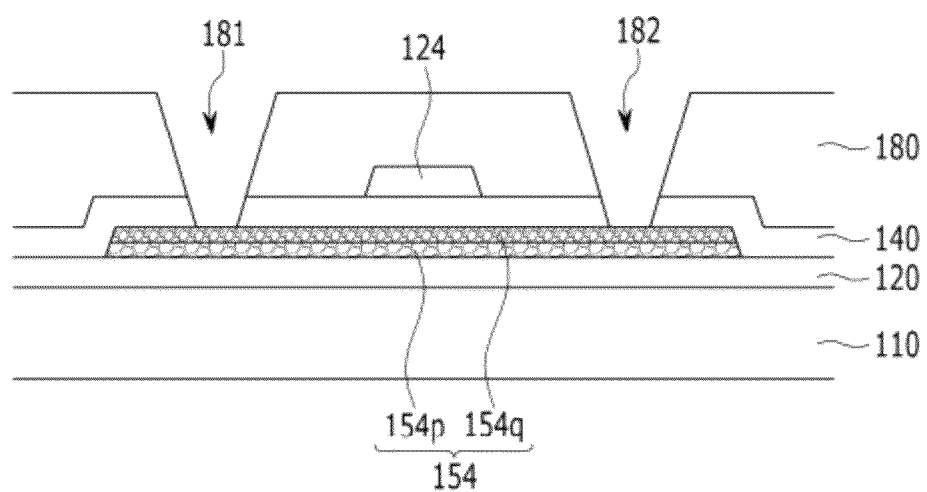

Referring to FIG. 10, the insulation layer 180 and the gate insulating layer 140 are patterned to form contact holes 181 and 182 exposing a part of the semiconductor pattern 154.

Referring to FIG. 5, a source electrode 173 and a drain electrode 175 respectively connected with a source region 154s and a drain region 154d of the semiconductor pattern 154 through contact holes 181 and 182 are formed on the insulation layer 180.

Hereinafter, referring to FIG. 11, a thin film transistor according to another embodiment will be described.

Figure 11:
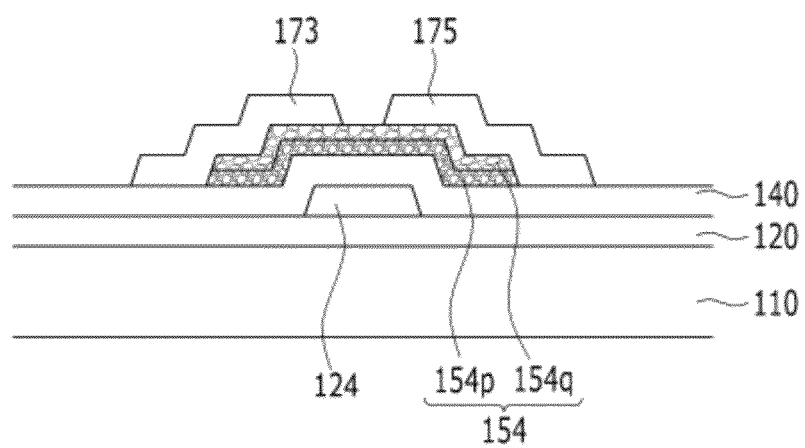
FIG. 11 illustrate a cross-sectional view of a thin film transistor according to another embodiment.

FIG. 11 is a cross-sectional view of a thin film transistor according to another embodiment.

A buffer layer 120 is formed on a substrate 110, and a gate electrode 124 is formed on the buffer layer 120. A gate insulating layer 140 is formed on the gate electrode 124, and a semiconductor pattern 154 including a lower semiconductor pattern 154p and an upper semiconductor pattern 154q made of polycrystalline silicon is formed on the gate insulating layer 140. The lower semiconductor pattern 154p and the upper semiconductor pattern 154q have different grain sizes from each other, as explained above. A source electrode 173 and a drain electrode 175 are formed on the semiconductor pattern 154.

The thin film transistor according to this embodiment, unlike the above-explained embodiment, has a bottom gate structure. Thus, unlike the above-explained embodiment, a channel of the thin film transistor is formed in the lower semiconductor pattern 154p. Therefore, contrary to the above-explained embodiment, the lower semiconductor pattern 154p has a smaller grain size than the upper semiconductor pattern 154q. For this purpose, when forming the lower semiconductor pattern 154p, hydrogen gas may be supplied together with silane gas, and when forming the upper semiconductor pattern 154q, argon gas may be supplied together with silane gas.

As explained above, by supplying different kinds of gases, a bilayer of amorphous silicon having different film qualities may be formed, and then, by crystallizing the bilayer using metal catalysts, defect density and grain size may be controlled without increasing the amount of metal catalyst. Thereby, grain size may be reduced while decreasing defect density in a channel-forming region of the thin film transistor, thereby increasing uniformity of thin film transistor characteristics. Further, since there is no need to increase the amount of metal catalyst for decreasing grain size of the channel-forming region of the thin film transistor, a leakage current increase due to the metal catalyst may be prevented.

The above-explained thin film transistor may be applied to an organic light emitting device.

The organic light emitting device includes a pixel electrode electrically connected with the above-explained thin film transistor, a common electrode opposite to the pixel electrode, and an emission layer positioned between the pixel electrode and the common electrode.

One of the pixel electrode and the common electrode may be an anode, and the other may be a cathode. The organic light emitting device may include two or more of the above-explained thin film transistors. Some of the thin film transistors may be used as switching thin film transistors and some of the thin film transistors may be used as driving thin film transistors.

Hereinafter, the present disclosure is illustrated in more detail with reference to examples. However, they are exemplary embodiments and the present disclosure is not limited thereto.

EXAMPLE

Formation of Polycrystalline Silicon Layer

On a glass substrate, silicon nitride with a thickness of about 1000 Å and silicon oxide with a thickness of about 5000 Å are sequentially deposited to form a buffer layer. Subsequently, on the buffer layer, silane gas and argon gas are supplied together respectively at flow rates of about 0.33 sccm and about 16 sccm to form a lower amorphous silicon layer with a thickness of about 200 Å by a chemical vapor deposition (CVD) method. Then, on the lower amorphous silicon layer, silane gas and hydrogen gas are supplied together respectively at flow rates of about 0.7 sccm and about 3.5 sccm to form an upper amorphous silicon layer with a thickness of about 400 Å by a chemical vapor deposition (CVD) method. Then, on the upper amorphous silicon layer, nickel (Ni) is supplied at an areal density of about $5*10^{13}$ $cm^{-1}$.

Then, the substrate is heat treated at a temperature of about 700° C. to form a bilayer of polycrystalline silicon.

Fabrication of Thin Film Transistor

The above-formed polycrystalline silicon bilayer is patterned. Subsequently, on the patterned polycrystalline silicon layer, silicon oxide and silicon nitride are formed by a chemical vapor deposition (CVD) method respectively with thicknesses of about 800 Å and about 400 Å. Then, on the gate insulating layer, aluminum (Al) and molybdenum (Mo) are formed by sputtering respectively with thicknesses of about 2000 Å and about 700 Å, and then the aluminum (Al) and molybdenum (Mo) are patterned to form a gate electrode. Then, using the gate electrode as a mask, the polycrystalline silicon layer is doped with boron (B) to form a source drain region. Then, on the gate electrode, silicon oxide and silicon nitride are coated as an insulation layer respectively with thicknesses of about 3000 Å and 2000 Å, and then the gate insulating layer and the insulation layer are patterned together to expose a part of the polycrystalline silicon layer. Then, on the insulation layer, molybdenum (Mo), aluminum (Al), and molybdenum (Mo) are formed respectively with thicknesses of about 700 Å, about 4000 Å, and about 700 Å, and then the molybdenum (Mo), aluminum (Al), and molybdenum (Mo) are patterned to form a source electrode and a drain electrode.

COMPARATIVE EXAMPLE

Formation of Polycrystalline Silicon Layer

On a glass substrate, silicon nitride with a thickness of about 1000 Å and silicon oxide with a thickness of about 5000 Å are sequentially deposited to form a buffer layer. Subsequently, on the buffer layer, silane gas and hydrogen gas are supplied together respectively at flow rates of about 0.7 sccm and about 3.5 sccm to form an amorphous silicon layer with a thickness of about 600 Å by a chemical vapor deposition (CVD) method. Then, on the amorphous silicon layer, nickel (Ni) is supplied at areal density of about $5*10^{13}$ $cm^{-2}$. Then, the substrate is heat treated at a temperature of about 700° C. to form a single layer of polycrystalline silicon.

Fabrication of Thin Film Transistor

Using the single layer of polycrystalline silicon, a thin film transistor is fabricated by substantially the same method as described in the Example.

Evaluation

The grain sizes, mean grain sizes, and grain size distributions of the polycrystalline silicon layers formed according to Example and Comparative Example are compared.

To measure the grain sizes, mean grain sizes, and grain size distributions, the polycrystalline silicon layers are etched so as to expose the grain boundary of the polycrystalline silicon, and then images are obtained by optical microscope and several tens of crystals are sampled to measure the means and distributions.

From the measurement results, it is confirmed that the upper polycrystalline silicon layer formed from the upper amorphous silicon layer of Example has a smaller grain size than the lower polycrystalline silicon layer formed from the lower amorphous silicon layer.

It is also confirmed that the polycrystalline silicon layer according to Example has a smaller mean grain size than the polycrystalline silicon layer according to Comparative Example. This is explained with reference to FIG. 12, FIG. 13, and Table 1.

Figure 12A:
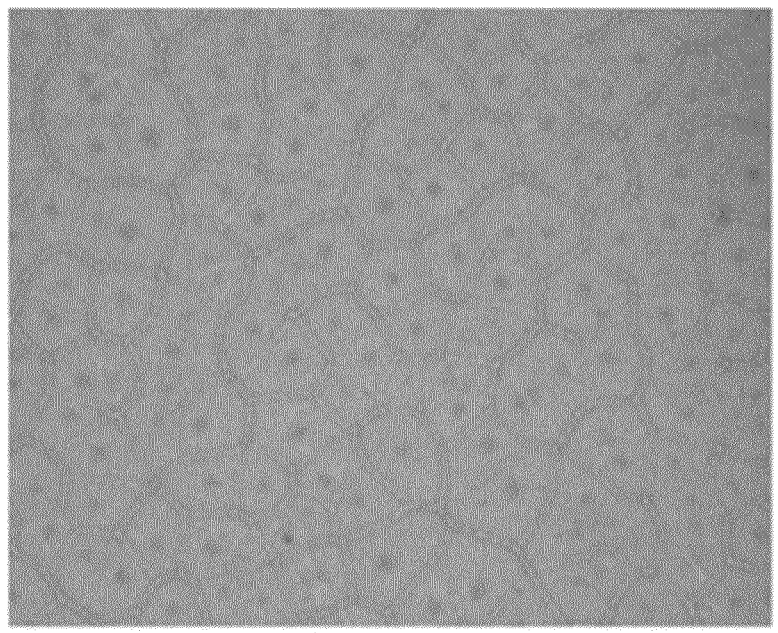
FIGS. 12A and 12B illustrate the grain sizes of the polycrystalline silicon layers according to Example and Comparative Example.
Figure 12B:
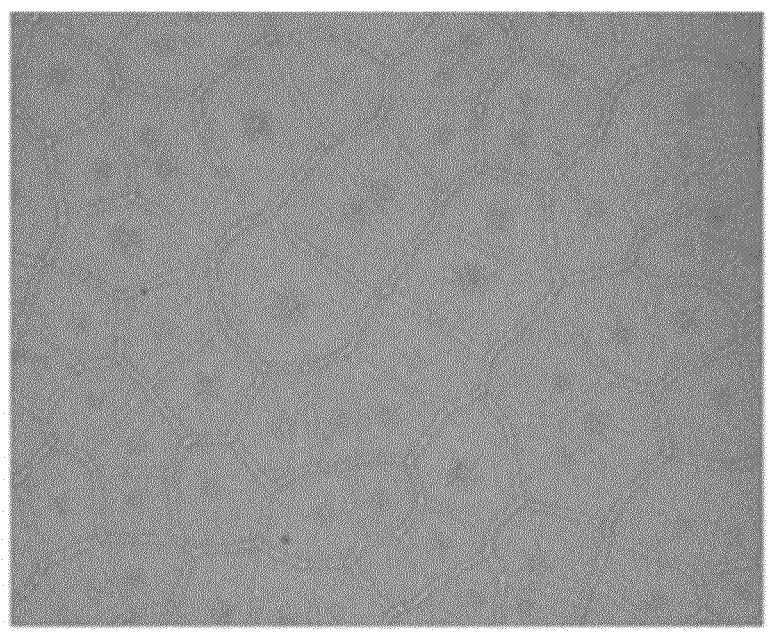
Figure 13:
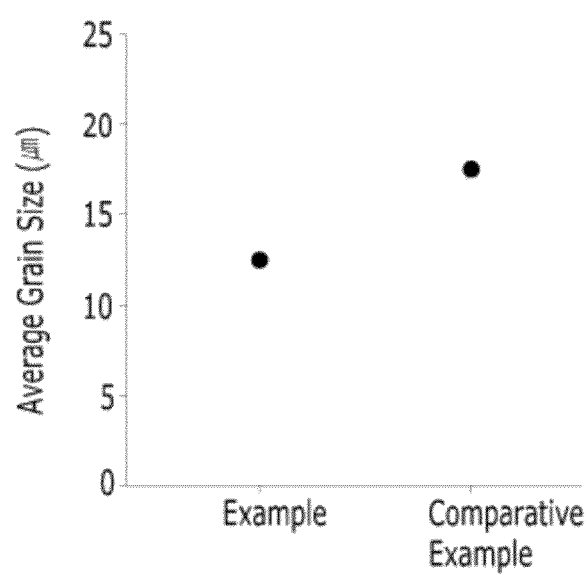
FIG. 13 illustrates mean grain sizes of the polycrystalline silicon layers according to Example and Comparative Example.

FIGS. 12A and 12B illustrate photographs showing the grain sizes of the polycrystalline silicon layer according to Example (FIG. 12A) and Comparative Example (FIG. 12B. FIG. 13 is a graph showing the mean grain sizes of the polycrystalline silicon layers according to Example and Comparative Example.

TABLE 1

|  | Mean grain size (μm) | Distribution |
| --- | --- | --- |
| Example | 13.3 | 0.10 |
| Comparative Example | 19.1 | 0.42 |

Referring to FIGS. 12A and 12B, it is confirmed that the polycrystalline silicon layer according to Example has a smaller grain size than the polycrystalline silicon layer according to Comparative Example.

Referring to FIG. 13 and Table 1, it can be seen that the polycrystalline silicon layer according to Example has a mean grain size of about 13 μm, while the polycrystalline silicon layer according to Comparative Example has a mean grain size of about 19 μm.

It can also be seen that the polycrystalline silicon layer according to Example has a smaller grain size distribution than the polycrystalline silicon layer according to Comparative Example. From these results, it can be seen that the polycrystalline silicon layer according to Example has a uniform grain size.

By way of summation and review, if the polycrystalline silicon layer is crystallized from a lower amorphous silicon layer and an upper amorphous silicon layer using a metal catalyst as described herein, defect density and grain size of the polycrystalline silicon layer may be controlled without increasing the amount of the metal catalyst. Thereby, grain size may be decreased while reducing defect density in the channel-forming region of a thin film transistor, thereby increasing uniformity of thin film transistor characteristics. Further, since there is no need to use more metal catalyst in order to decrease grain size in the channel-forming region of the thin film transistor, leakage current increase due to the metal catalyst may be prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a polycrystalline silicon layer, comprising:
   forming a first amorphous silicon layer and a second amorphous silicon layer such that the first amorphous silicon layer and the second amorphous silicon layer have different film qualities from each other; and
   crystallizing the first amorphous silicon layer and the second amorphous silicon layer using a metal catalyst to form a first polycrystalline silicon layer and a second polycrystalline silicon layer,
   wherein the forming of the first amorphous silicon layer and the second amorphous silicon layer includes:
   depositing the first amorphous silicon layer while providing a first gas with silane gas; and
   depositing the second amorphous silicon layer while providing a second gas with silane gas,
      wherein the first gas and the second gas are different gases and are different from silane gas.

2. The method as claimed in claim 1, wherein the first polycrystalline silicon layer and the second polycrystalline silicon layer have different grain sizes from each other.

3. The method as claimed in claim 2, wherein the second polycrystalline silicon layer has a smaller grain size than the first polycrystalline silicon layer.

4. The method as claimed in claim 1, wherein an amount of the metal catalyst used in the first amorphous silicon layer and an amount of the metal catalyst used in the second amorphous silicon layer are substantially equivalent.

5. A method of forming a polycrystalline silicon layer, comprising:
   forming a first amorphous silicon layer and a second amorphous silicon layer such that the first amorphous silicon layer and the second amorphous silicon layer have different film qualities from each other; and
   crystallizing the first amorphous silicon layer and the second amorphous silicon layer using a metal catalyst to form a first polycrystalline silicon layer and a second polycrystalline silicon layer,
   wherein:
      the first polycrystalline silicon layer and the second polycrystalline silicon layer have different grain sizes from each other,
      the second polycrystalline silicon layer has a smaller grain size than the first polycrystalline silicon layer,
      the forming of the first amorphous silicon layer and the second amorphous silicon layer having different film qualities from each other includes depositing the first amorphous silicon layer while providing a first gas and depositing the second amorphous silicon layer while providing a second gas,
      the first gas includes argon gas, and
      the second gas includes hydrogen gas.

6. The method as claimed in claim 5, wherein the first polycrystalline silicon layer and the second polycrystalline silicon layer include silicide formed by bonding of the metal catalyst and silicon, and the first polycrystalline silicon layer has a higher silicide content than the second polycrystalline silicon layer.

* * * * *